THYRISTOR SWITCH CIRCUIT HAVING FAST PULSE-TERMINATING MEANS

Filed April 10, 1967 2 Sheets-Sheet 1

INVENTORS W. B. HARRIS
R. P. MASSEY
BY [signature]
ATTORNEY

Jan. 13, 1970 W. B. HARRIS ET AL 3,489,928

THYRISTOR SWITCH CIRCUIT HAVING FAST PULSE-TERMINATING MEANS

Filed April 10, 1967 2 Sheets-Sheet 2

United States Patent Office 3,489,928

Patented Jan. 13, 1970

3,489,928

THYRISTOR SWITCH CIRCUIT HAVING FAST PULSE-TERMINATING MEANS

William B. Harris, Bernardsville, and Richard P. Massey, Westfield, N.J., assignors to Bell Telephone Laboratories Incorporated, Murray Hill, N.J., a corporation of New York Filed Apr. 10, 1967, Ser. No. 629,712

Int. Cl. H03k 3/26

U.S. Cl. 307—284 22 Claims

ABSTRACT OF THE DISCLOSURE

In a switch circuit having a thyristor for producing rectangular pulses, a pulse-terminating network is employed for materially shortening the fall time of the pulses. This network comprises a second thyristor which is subject to being unintentionally fired by the high rate effect created when the first thyristor is triggered. Such undesired firing is prevented by safety means comprising a resonant circuit which is slowly charged through a high resistor for gradually applying voltage to the second thyristor so that it will have a voltage impressed across it equal to the supply voltage before the first thyristor is fired. Premature voltage development across the load is blocked by a diode connected between the two thyristors.

BACKGROUND OF THE INVENTION

This invention relates to improved semiconductor switch circuits capable of operating at high speeds in high power circuits for producing rectangular pulses having variable widths and fast fall times.

Semiconductor switches of the prior art have used a variety of semiconductor devices. The semiconductor devices most commonly used in switch circuits are four-layer PNPN devices known as silicon controlled rectifiers or thyristors. As is well known, a PNPN device is usually provided with three terminals and has properties somewhat analogous to a gas-filled thyratron and, like the thyratron, once it is switched on, it remains conductive until a turn-off mechanism is operated. Although the operating speed of the thyristor is inherently much greater than that of the thyratron, some utilization circuits require faster operating speeds than those for which a thyristor is inherently capable.

The need for faster operating speeds has been met by a prior art thyristor switch circuit which is disclosed and claimed in a copending patent application filed by W. B. Harris, R. P. Massey, and F. J. Zgebura. This prior application, bearing Ser. No. 537,544, was filed on Mar. 25, 1966 and is now Patent No. 3,404,293 which is assigned to the same assignee as the present application. The circuit of this copending application is described in detail hereinafter with reference to FIG. 1 of the drawing.

Although this prior art circuit has made it possible to reduce the turn-off time of the thyristor switch to one-half or less of its inherent turn-off time, it is not fully satisfactory for all purposes. The reason for this is that a pulse produced by this switch circuit has a relatively slow fall time due to the capacity effect inherent in the load, or utilization circuit, and also to residual energy stored in the turn-off circuit.

Accordingly, it is an object of this invention to provide a pulse-producing thyristor switch circuit with means for substantially shortening the fall time of the pulses.

SUMMARY OF THE INVENTION

The invention comprises a thyristor switch circuit for generating rectangular pulses across a load circuit having an appreciable capacitance. The switch circuit comprises a conventional reverse current turn-off circuit and an impedance connected between the gate and cathode of the thyristor to reduce false triggering from the rate effect. Both the rate effect and the turn-off capabilities are improved by connecting a diode between the gate and cathode of the thyristor, and another diode between the gate and anode of the thyristor. These diodes are so constructed that the reverse recovery time of the middle junction in the thyristor is less than that of the first diode and greater than that of the second diode.

The fall time of a pulse produced by this thyristor switch circuit is substantially shortened by connecting across the load a pulse terminating network comprising another thyristor. When this second thyristor is rendered conductive, it provides a shunt path across the load circuit and thereby terminates the pulse abruptly so that it has a sudden fall time. Undesired firing of the pulse-terminating thyristor, such as might be caused by the high rate effect produced by the firing of the first thyristor, is prevented by employing safety means comprising a resonant circuit which is slowly charged through a high resistor for gradually developing a voltage across the pulse-terminating thyristor that will be equal to the supply voltage before the pulse-forming thyristor is fired. Premature voltage development across the load is blocked by an isolation diode connected between the two thyristors. Improved control of the timing of the firing of the pulse-terminating thyristor is obtained by employing circuit means for automatically triggering it with the same energy that is used to turn off the pulse-forming thyristor. The switch circuit also includes an improved and simplified limiter circuit which comprises a single inductor and a single resistor with a pair of steering diodes connected across them. When it is desired to employ this switch circuit for producing pulses having variable widths, a third thyristor is connected between the load and the pulse-forming thyristor.

BRIEF DESCRIPTION OF THE DRAWING

The features of this invention are fully discussed hereinafter in relation to the following detailed description of the drawing in which.

DETAILED DESCRIPTION

Figure 1:
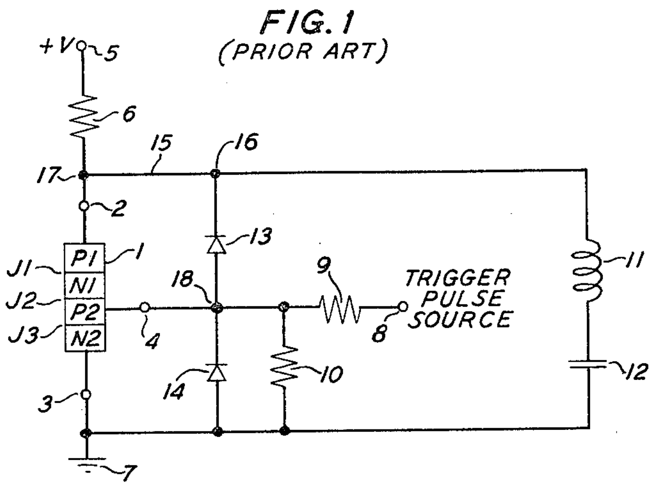
FIG. 1 (PRIOR ART)
FIG. 1 discloses the thyristor switch circuit of the above-mentioned copending application.

The switch circuit of the above-mentioned copending patent application is shown in FIG. 1 as utilizing a single thyristor 1 comprising four layers having regions P1, N1, P2, and N2 with junctions J1, J2, and J3 between them. The thyristor 1 is provided with an anode terminal 2 connected to the upper outer layer P1, a cathode terminal 3 connected to the lower outer layer N2, and a gate terminal 4 connected to the lower intermediate layer P2. A supply source of direct voltage has its positive side connected to a terminal 5 and is coupled through a load resistor 6 to the anode terminal 2. The cathode terminal 3 is connected to a source of ground potential 7 which is understood to be connected to the negative side of the source of direct voltage.

The switch circuit further includes a source 8 of trigger pulse current which is coupled through a resistor 9 to the gate terminal 4 and through a resistor 10 to the cathode terminal 3. As is well known in the art, a positive trigger pulse from source 8 will cause current to flow through the divider resistors 9 and 10 thereby producing a potential difference between the gate terminal 4 and the cathode terminal 3. This functions to trigger the thyristor 1 by substantially reducing the impedance between the anode terminal 2 and the cathode terminal 3. The triggering of the thyristor 1 causes current to flow from the source 5 of positive direct voltage, through the load resistor 6, through the anode-cathode path in the thyristor 1 to the ground 7, and then back to the negative side of the direct voltage supply.

At this point attention should be directed to a resonant turn-off circuit that comprises an inductor 11 and a capacitor 12 which are connected in series across the anode terminal 2 and the cathode terminal 3. Prior to the triggering of the thyristor 1, the capacitor 12 is charged to the same potential as that of the direct voltage source at terminal 5. When the thyristor is triggered, it becomes conductive and initiates the generation of a pulse across the load resistor 6. Also, at this time, a ringing current starts through inductor 11, thyristor 1, and capacitor 12. The first half cycle of this ringing current flows from the capacitor 12 through the inductor 11 and then in the forward direction through the thyristor 1.

At the beginning of the second half cycle, the ringing current reverses in phase and flows through the thyristor 1 in the reverse direction. This reverse ringing current quickly exceeds the normal load current thereby providing a net reverse current which flows from the cathode terminal 3, through all three of the junctions J1, J2, and J3, and then to the anode terminal 2.

In order to reduce the time required to restore the forward-blocking capability of the thyristor 1 and also to improve its dynamic breakdown capability, two diodes 13 and 14 are connected in series across the anode terminal 2 and the cathode terminal 3. It can be seen in FIG. 1 that this connection uses a lead 15 for connecting a point 16 between the inductor 11 and the upper diode 13 to a point 17 between the load resistor 6 and the anode terminal 2. The point 18 between the diodes 13 and 14 is joined to the conductor extending from the gate terminal 4 to the resistor 9 and the source 8 of trigger pulse current.

As is described in the above-mentioned copending application, the lower diode 14 has a reverse recovery time which is longer than the reverse recovery time of the middle junction J2 of the thyristor 1. Conversely, the upper diode 13 has a reverse recovery time which is less than the reverse recovery time of the junction J2. In other words, the reverse recovery time of the middle junction J2 is less than that of the lower diode 14 and is greater than that of the upper diode 13.

It should be noted that at the beginning of the second half cycle of the ringing current, the ringing current will be a reverse current for the two outer junctions J1 and J3 but will be a forward current for the middle junction J2. Therefore, the lower diode 14 will be momentarily reverse biased by the charge stored in the lower junction J3 while the upper diode 13 will be biased below its threshold voltage by the opposed charges in junctions J1 and J2. This condition of the diodes 13 and 14 permits the reverse ringing current to flow through the thyristor 1 at the start of the second half cycle.

However, the flow of reverse ringing current quickly functions to reduce the charge density in junction J3 to zero thereby causing it to recover and open. This does not terminate the pulse because the pulse current across the load resistor 6 is maintained by the flow of current through the diode 14. During the transition in junction J3, the current flow through the lower diode 14 will incerase and will reach a point at which the diode 14 will be carrying all of the reverse current.

Since the reverse ringing current is also a reverse current for the upper junction J1, the junction J1 will partially recover during the time that the lower junction J3 is carrying reverse current. When this lower junction J3 fully recovers, the reverse current will flow through the lower diode 14, through the gate terminal 4 and into the middle junction J2, and then out through the upper junction J1. This forces the upper junction J1 to complete its recovery and reduces its charge density to zero. In other words, the upper junction J1 is forced to recover due to a forward current flowing through the middle junction J2 and increasing the hole storage effect in junction J2.

During this change in junction J1, the current flowing through junctions J1 and J2 will be reduced toward zero while the current flowing through the upper diode 13 will be correspondingly increased to the limit of the reverse ringing current. This flow of current through the upper diode 13 will cause an additional charge to be stored in the lower diode 14. It should be noted that, since the middle junction J2 had been forward biased, the existing charge density in this junction J2 is not zero and it begins to recovery by recombination. The thyristor 1 is now open at both junctions J1 and J3 and further reverse current is unnecessary except to store more charge in the lower diode 14.

During the latter portion of the second half cycle of ringing current, a second forward current will be applied to the thyristor 1 due to the fact that the reverse recovery time of the upper diode 13 is less than the reverse recovery time of the middle junction J2. Accordingly, this current will flow in the forward direction through the upper junction J1 and in the reverse direction through the middle junction J2 and the lower diode 14. This forces junction J2 to recover while diode 14 completes its recovery by recombination.

By thus designing diode 14 to recover more slowly than the middle junction J2, gate triggering of the thyristor 1 is prevented as is explained in the abovementioned copending patent application. In addition, this provides a low impedance between the cathode terminal 3 and the gate terminal 4 for a short interval after the thryistor 1 recovers and thus improves the rate effect capability of this switch circuit.

As was stated above, the switch circuit of FIG. 1 has the advantage of possessing a fast operating speed for producing pulses. However, it is not fully satisfactory for all purposes because a pulse produced by this switch circuit has a relatively slow fall time due to the capacity effect inherent in the load and also to residual energy stored in the turn-off circuit. Furthermore, if the load circuit should include a substantial capacitance, such as might be caused by the incorporation therein of a traveling wave tube, then the fall time of a pulse would be materially lengthened.

Therefore, it is an object of the present invention to provide an improved pulse-terminating network for substantially shortening the fall time of a pulse produced by a thyristor switch circuit having a substantial capacitance in its load circuit. Another object of the invention is to provide improved means for triggering a pulse-terminating network with the same energy that is used to turn off an associated thyristor switch. Still another object of the invention is to provide an improved limiter circuit for use with a thryistor switch having an appreciable capacitance in its load circuit.

Figure 2:
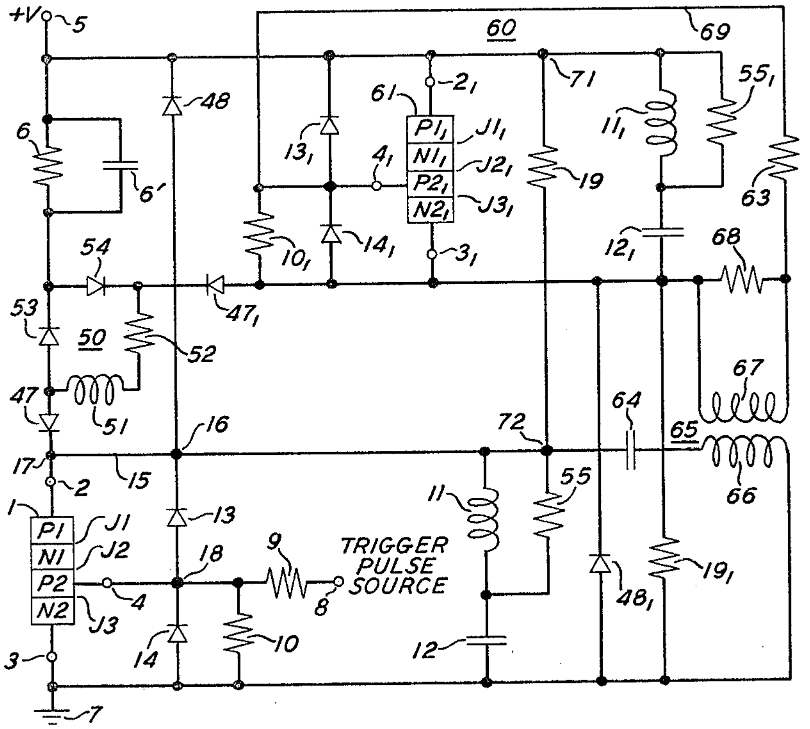
FIG. 2 represents the manner in which the switch circuit of FIG. 1 is modified to include an improved current limiter and an improved pulse-terminating network in accordance with the present invention.

These and other objects of the invention are accomplished in accordance with this invention by modifying the prior art switch circuit of FIG. 1 in the manner shown in FIG. 2. Since the thyristor switch circuit of FIG. 2 is a modification of the circuit of FIG. 1, those elements of FIG. 2 that are the same as those in FIG. 1 have been identified by giving them the same reference designations.

When the circuit of FIG. 2 is compared with the circuit of FIG. 1, it can be seen that the circuit of FIG. 1 has been modified by providing the load resistor 6 with a parallelly connected capacitor 6′ which represents an appreciable capacitance in the load circuit, such as that which might be provided by a traveling wave tube. A clamping diode 48, which is discussed at a later point, has its cathode connected to the power source 5 and its anode connected to the point 16 which is between the inductor 11 and the upper diode 13.

An improved current limiter 50 is connected between the load resistor 6 and the point 17 leading to the anode terminal 2 of the thryistor 1. Instead of the usual two inductors and two resistors, the current limiter 50 comprises a single inductor 51, a single resistor 52, and a pair of steering diodes 53 and 54. The current limiter 50 is coupled to the point 17 by an isolation diode 47 for a reason that is explained hereinafter.

An improved pulse-terminating network 60 is shown to include a thyristor 61 comprising four layers $P1_1$, $N1_1$, $P2_1$ and $N2_1$, with junctions $J1_1$, $J2_1$, and $J3_1$ between them. The thyristor 61 is equipped with an anode terminal $2_1$, a cathode terminal $3_1$, and a gate terminal $4_1$, as is shown in FIG. 2. The anode terminal $2_1$ is connected to an inductor $11_1$, and the cathode terminal $3_1$ is connected to a capacitor $12_1$. The inductor $11_1$ and the capacitor $12_1$ form a resonant circuit which is combined with a pair of diodes $13_1$ and $14_1$ for establishing a turn-off circuit similar to that described above in relation to FIG. 1. However, in the circuit of FIG. 2, a damping resistor 55 has been connected across the inductor 11 and a similar damping resistor $55_1$ has been connected across the inductor $11_1$.

A resistor $10_1$, similar to the resistor 10, is connected across the diode $14_1$. The thyristor 61 has its anode terminal $2_1$ connected to the power source 5 while its cathode terminal $3_1$ is connected to the resistor 52 in the current limiter 50 by means of an isolation diode $47_1$. The power source 5 and the anode terminal $2_1$ are also connected to a high resistance 19 which, in turn, is connected to the resonant circuit comprising the inductor 11 and the capacitor 12 for providing means for charging the capacitor 12. The capacitor 12 is connected through a clamping diode $48_1$ to the cathode terminal $3_1$. The cathode terminal $3_1$ is also connected to a high resistance $19_1$ which is in parallel with the diode $48_1$. Since this high resistance $19_1$ has one end connected to the ground 7 and its other end connected to the capacitor $12_1$, it functions as means for charging the capacitor $12_1$ from the power source 5.

A transformer 65 has its primary winding 66 connected through a capacitor 64 to the upper end of the inductor 11. The secondary winding 67 of the transformer 65 is bridged by a damping resistor 68. One end of the resistor 68 is connected by a curernt-limiting resistor 63 and a lead 69 to the gate terminal $4_1$ of the thyristor $2_1$.

The thyristor switch circuit of FIG. 2 is normally open, as was the case with the circuit of FIG. 1, due to the relatively high impedance that now exists between the anode terminal 2 and the cathode terminal 3. The switch circuit of FIG. 2 is put into operation in the same manner as is described above for the circuit of FIG. 1; namely, by applying a trigger pulse from the source 8 for reducing the impedance between the anode terminal 2 and the cathode terminal 3.

The triggering of the thyristor 1 renders it conductive thereby causing ringing current to flow through the thyristor 1 in the forward direction. Current from the power supply source 5 will now flow through the load resistor 6, through the diode 54, resistor 52, inductor 51, diode 47, and then through the thyristor 1 to ground 7. This produces the leading edge of a pulse across the load resistor 6.

The total current through the thyristor 1 will now be the sum of the load current through the load resistor 6 and the initial half cycle of the ringing current.

The current limiter 50 functions to limit the charging and discharging of the load capacitance 6'. Generally, this function is performed by two current limiters, one of which serves to limit the charging of the load capacitance 6' and the other limits its discharge. However, as is shown in FIG. 2, these two operations can be performed by the single inductor 51 and the single resistor 52 through the assistance of the steering diodes 53 and 54.

It should be noted that the cathode terminal $3_1$ of the second thyristor 61 is connected to ground 7 by means of the high resistance $19_1$ while it is isolated from the power supply voltage by means of the diode $47_1$. This enables the thyristor 61 to acquire slowly a voltage across it before the first thyristor 1 is fired. This voltage is equal to the supply voltage from the source 5 and is developed across the thyristor 61 by means of the resonant circuit comprising the inductor $11_1$ and the capacitor $12_1$. Thus, the high rate effect caused by the firing of the first thyristor 1 is minimized and the second thyristor 61 is not turned on at this time. This is a desirable feature because, if the second thyristor 61 should be turned on immediately in response to the high rate effect caused by the firing of the first thyristor 1, it would close a shunt path across the load 6–6' thereby rending the switch circuit inoperative. In other words, the pulse terminating thyristor 61 would be subject to being unintentionally fired by the high rate effect impressed across it when the pulse-forming thyristor 1 is turned on. Such undesired firing of the pulse-terminating thyristor 61 is prevented by employing safety means for slowly developing, before the first thyristor 1 is turned on, a voltage across the thyristor 61 which is substantially equal to the supply voltage from the source 5. These safety means include the resonant circuit $11_1$–$12_1$ which is connected across the anode terminal $2_1$ and the cathode terminal $3_1$ of the thyristor 61. The safety means further include charging means comprising the high resistance $19_1$ which has one end connected to the ground 7 and which has its other end coupled to the anode terminal $2_1$ of the thyristor 61 by means of the resonant circuit $11_1$–$12_1$. This resistor $19_1$ enables the capacitor $12_1$ to be slowly charged to the value of the supply voltage from the source 5.

It should also be noted that the clamping diode 48 provides an escape path for over-voltage from the ringing inductor 11. Similarly, the clamping diode $48_1$ prevents the application of over-voltage across thyristor 61 at the time the first thyristor 1 was fired.

The second half cycle of the ringing current provides the reverse current for turning off the thyristor 1 in the manner described above, but, as also explained above in the description of FIG. 1, the pulse across the load resistor 6 is maintained by the flow of current through the diodes 13 and 14. However, the diode 13 soon turns off, and a second forward current flows through the middle junction J2 and the diode 14 as was explained above. Since this current is a reverse current for the middle junction J2, the middle junction J2 is forced to recover quickly. If this second forward current did not flow, the switch circuit would produce a drop, or notch, at the top of the pulse shortly before its termination.

It should be noted that the timing of the firing of the pulse terminating thyristor 61 is critical in order to provide optimum wave-shape of the pulse and also to obtain minimum interpulse spacing. Firing of the thyristor 61 at the most suitable time is accomplished by automatically applying trigger energy to its gate terminal $4_1$. This is accomplished by means of the transformer 65 in cooperation with the capacitor 64 as will now be explained.

Near the end of its second half-cycle, the ringing current developed in the capacitor 12 and inductor 11 is substantially equal to the load current across the resistor 6. Therefore, at this time, the voltage across the load capacitor 6' is the same as the voltage of the source 5. The voltage across the ringing capacitor 12 is, at this time, slightly less than the potential of the source 5, but the voltage across the capacitor 64, which is associated with the transformer 65, is approximately zero volts. Up to this time, the diodes 13 and 14 had been conductive.

Shortly thereafter, the value of the ringing current drops below the value of the load current in the resistor 6. At this point, the diode 13 turns off because it is designed to have fast recovery. As was described above, a second forward current now flows through the middle junction J2 and the diode 14. When the value of the second half cycle of ringing current becomes zero, the middle junction J2 is designed to turn off at this time, or shortly thereafter, thereby terminating the flat top of the pulse across the load. The trailing edge of this pulse would ordinarily have a slow fall time if it were not for the pulse-terminating network of this invention.

At this time, when the value of the second half cycle of ringing current becomes zero, the voltage at the anode of the diode 47 starts to increase with respect to ground potential at the same rate as the voltage decays across the load in accordance with the slow time-constant determined by resistor 6 and capacitor 6'. The voltage at the point 17 and the point 72 will now quickly rise with respect to ground potential at a rate determined by three currents acting to charge the capacitor 64, which is much smaller than the capacitor 12.

The first of these currents is from the inductor 11. The second is from capacitor 12 through the damping resistor 55. The third is from the power source 5, through the resistor 19, and into the capacitor 64. Since the voltage at the point 17 increases more quickly than the voltage at the anode of diode 47, the diode 47 will soon turn off thereby isolating the capacitor 64 from the load.

The capacitor current, which is flowing through the associated primary winding 66 of the transformer 65, induces current into the secondary winding 67. This induced current flows through the current-limiting resistor 63 and along the lead 69 to the gate terminal $4_1$ of the pulse-terminating thyristor 61. This current has the correct polarity for triggering the thyristor 61 and quickly reaches the value necessary for performing this function.

As soon as the thyristor 61 becomes conductive, the load capacitor 6' discharges over a path extending through the thyristor 61, diode $47_1$, current-limiter 52–51, and diode 53. The value of the discharge current is limited by the values that have been selected for the resistor 52 and the inductor 51. This discharging of the load capacitor 6' causes the pulse to be terminated in a sudden fall time which will be materially shorter than the fall time of a pulse generated by a switch circuit similar to the circuit of FIG. 1 but having an appreciable capacitance in its load circuit.

When the thyristor 61 becomes conductive, it also closes a path for the power supply current to flow from the source 5, through the thyristor 61, diode $47_1$, resistor 52, inductor 51, diode 47, lead 15, inductor 11, and then through the capacitor 12 to ground 7. This charges the capacitor 12 in preparation for the next triggering of the thyristor 1.

Also, at the time the thyristor 61 becomes conductive, the capacitor $12_1$ discharges as a ringing current through the inductor $11_1$. Thus, the second thyristor 61 will be turned off by means of the reverse current turn-off circuit $11_1$, $12_1$, $13_1$, and $14_1$ in substantially the same manner as was described above in relation to the thyristor 1.

Figure 3:
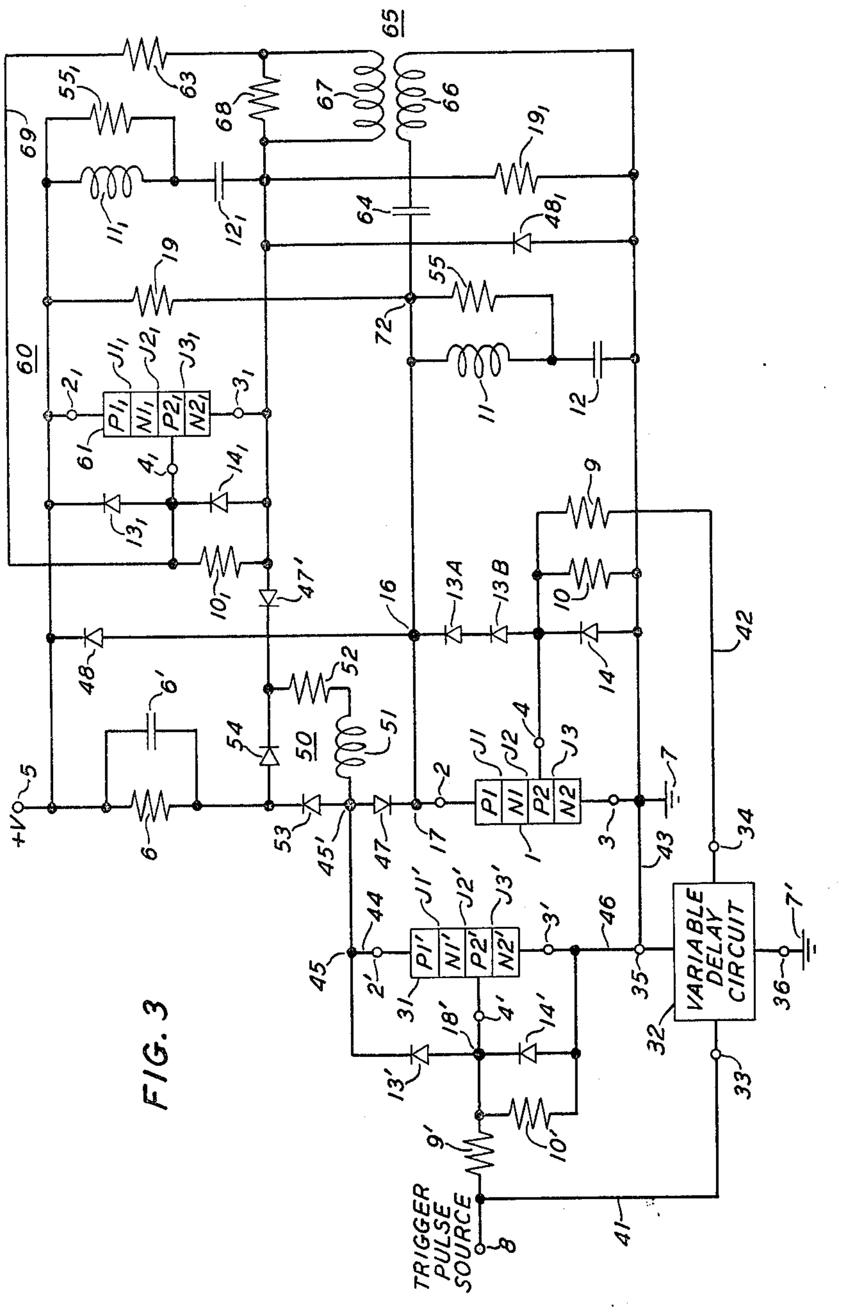
FIG. 3 illustrates the manner in which a third thyristor is added to the switch circuit of FIG. 2 for variably lengthening the duration of a pulse generated by this circuit.

The length or duration of a pulse produced by the switch circuit of this invention can be varied by modifying the circuit of FIG. 2 to include a third thyristor having at least one connection to a point between the load resistor 6 and the anode terminal 2 of the first thyristor 1. Thus, the length of a pulse can be variably increased by connecting the third thyristor in parallel with the first thyristor 1 as is represented in FIG. 3. Since the circuit illustrated in FIG. 3 is a modification of the circuit of FIG. 2, the same reference designations are used in each circuit for identifying elements that are common to both of these circuits.

Accordingly, it can be seen that the pulse-lengthening circuit of FIG. 3 is provided with a third thyristor 31 comprising four layers having regions P1', N1', P2', and N2' with junctions J1', J2', and J3' between them. The thyristor 31 is equipped with an anode terminal 2' connected to the upper outer layer P1', a cathode terminal 3' connected to the lower outer layer N2', and a gate terminal 4' connected to the lower intermediate layer P2'.

This third thyristor 31 is inserted into the circuit of FIG. 2 by connecting its anode terminal 2' by a lead 44 to a point 45 that is located between the current-limiter 51–52 and the anode of the diode 47, and also by connecting its cathode terminal 3' to the ground 7 in part by way of a lead 46. Thus, the third thyristor 31 is connected in parallel with the first thyristor 1.

Two diodes 13' and 14', which are similar to the diodes 13 and 14 in FIG. 2, have a point 18' between them connected to the gate terminal 4' of the thyristor 31. The diode 13' has its cathode connected to the point 45, and the diode 14' has its anode connected to the cathode terminal 3' of the thyristor 31. A resistor 9' corresponding to the resistor 9, has one end connected to the trigger pulse source 8 and its other end connected through the point 18' to the gate terminal 4'. A resistor 10', similar to the resistor 10, is connected across the diode 14'.

It is important to note that the application of a trigger pulse from the source 8 to the first thyristor 1 is, in this circuit of FIG. 3, delayed by means of a variable delay circuit 32. This delay circuit 32 may be any suitable type that is commercially available and it is provided with an input terminal 33, two output terminals 34 and 35, and a ground terminal 36 leading to a source 7' of ground potential. The input terminal 33 is connected by a lead 41 to the source 8 of trigger pulse current. One output terminal 34 is connected by a lead 42 to the resistor 9, and the other output terminal 35 is connected by a lead 43 to the lower end of the resistor 10. The delay circuit 32 further includes adjustable means, well-known to those skilled in the art, for providing variable lengths of delay in the passage therethrough of a trigger pulse.

When a trigger pulse is transmitted from the source 8, the pulse-lengthening thyristor 31 is rendered conductive. This permits current from the power supply source 5 to flow through the load resistor 6, diode 54, resistor 52, inductor 51, point 45, through the thyristor 31, and then along the leads 46 and 43 to ground 7. Thus, although the delay circuit 32 prevents the trigger pulse from reaching the first thyristor 1 at this time, the formation of the leading edge of a pulse across the load resistor 6 will now be started.

At the end of the delay period of the delay circuit 32, the trigger pulse is applied to the first thyristor 1 and causes it to become conductive. This permits ringing current from the capacitor 12 and inductor 11 to flow through the thyristor 1 to ground 7.

The second half cycle of the ringing current provides the reverse current for turning off the thyristor 1, in the manner described above, and for effecting the termination of the pulse. At this time, the ringing current also turns off the third thyristor 31. The trailing edge of the pulse would ordinarily have a relatively slow fall time due to the reasons explained above. However, the pulse is now terminated with a fast fall time because of the action of the pulse-terminating network 60 which includes the thyristor 61. The thyristor 61 is triggered with the same energy that is used to turn off the thyristors 1 and 31. As was explained above, this trigger energy is transmitted through the capacitor 64 and is applied through the transformer 65 and over the lead 69 to the gate terminal $4_1$ of the thyristor 61. The thyristor 61 now becomes conductive and functions to terminate the pulse in an abrupt fall time in the same manner as is explained above in relation to the circuit of FIG. 2. Thus, the switch circuit of FIG. 3 will produce a pulse that is longer than a pulse generated by the circuit of FIG. 2. The additional length of the pulse will be approximately equal to the delay period of the delay circuit 32. As was explained above, this delay period can be varied by suitable adjustments of the delay circuit 32.

What is claimed is:

1. A switch circuit comprising at least a first thyristor and a second thyristor, a source of trigger pulse current, means adapted for applying a pulse of trigger current to said first thyristor for turning it on, and a resonant turn-off circuit adapted for producing electric energy for forcibly turning off first thyristor, said switch circuit being characterized by having means adapted for turning on said second thyristor with the same electric energy that is used for forcibly turning off said first thyristor.

2. A switch circuit adapted for producing a pulse, said switch circuit comprising a first thyristor, triggering means adapted for turning on said first thyristor for initiating the generation of a pulse, a resonant turn-off circuit adapted for producing electric energy, means for applying said electric energy to said first thyristor for turning it off while maintaining said pulse, pulse-terminating means adapted for terminating the generation of said pulse, said pulse-terminating means including a second thyristor, said switch circuit being characterized by having control means adapted for turning on said second thyristor with the same electric energy that is used for turning off said first thyristor, said control means including a capacitor connected to said resonant turn-off circuit, means for applying charging current to said capacitor, and a transformer having a primary winding connected to said capacitor and a secondary winding coupled to said second thyristor whereby the capacitor current is induced in said transformer and applied to said second thyristor for turning it on.

3. A pulse switching circuit comprising a thyristor adapted for producing a pulse, said thyristor having an anode terminal, a source of direct voltage, a utilization circuit including a load resistor having one end connected to said source, said utilization circuit also including a load capacitor connected in parallel with said resistor, a current limited for coupling said load capacitor and the other end of said load resistor to said anode terminal of said thyristor, said current limiter comprising a single resistor connected in series with a single inductor, and said current limiter further comprising a serially connected pair of steering diodes bridged across said single resistor and said single inductor.

4. A pulse switching circuit in accordance with claim 3 wherein each of said steering diodes includes an anode and a cathode, wherein one of said diodes has its anode connected to said load capacitor and its cathode connected to said single resistor, and wherein the other of said diodes has its anode connected to said inductor and its cathode connetced to said load capacitor, 5. A pulse switching circuit comprising a source of direct voltage, a normally non-conductive pulse-forming thyristor having anode, cathode, and gate terminals, said cathode terminal being connected to a point of ground potential, a utilization circuit including a load resistor connected in series with said source and said anode and cathode terminals, starting means for initiating the generation of a pulse across said load resistor, said starting means including means for applying trigger energy to said gate terminal for firing said thyristor for rendering it conductive whereby a circuit path is closed from said source through said load resistor and said thyristor to said point of ground potential, terminating means for terminating said pulse in a sudden fall time, said terminating means including a normally non-conductive pulse-terminating thyristor having anode, cathode, and gate terminals, means for connecting said anode terminal of said pulse-terminating thyristor to said source, circuit means for connecting said cathode terminal of said pulse-terminating thyristor to said point of ground potential, and control means for applying electric energy to said gate terminal of said pulse-terminating thyristor for firing it and rendering it conductive whereby a shunt path is abruptly closed across said load resistor for suddenly terminating said pulse, said switching circuit being characterized in that it further comprises safety means for preventing undesired firing of said pulse-terminating thyristor that might otherwise be caused by the high rate effect produced by the firing of said pulse-forming thyristor, said safety means including charging means for slowly developing a potential across said pulse-terminating thyristor equal to the potential of said source before the firing of said pulse-forming thyristor, said charging means including a resistor having one end connected to said point of ground potential, and means for coupling the other end of said resistor to said anode terminal of said pulse-terminating thyristor.

6. A pulse-switching circuit in accordance with claim 5 wherein said last-mentioned means include a resonant circuit.

7. A pulse-switching circuit in accordance with claim 5 and further comprising turn-off means including a resonant circuit for producing electric energy for turning off said pulse-forming thyristor, and wherein said electric energy applied by said control means for turning on said pulse-terminating thyristor is a portion of said electric energy produced by said resonant circuit.

8. A pulse-switching circuit in accordance with claim 7 wherein said control means include a capacitor connected across said resonant circuit for being charged with said electric energy produced by said resonant circuit.

9. A pulse-switching circuit in accordance with claim 8 and further comprising additional means for charging said capacitor, said last-mentioned means including a resistor for coupling said source of direct voltage to said capacitor.

10. A pulse-switching circuit in accordance with claim 8 wherein said control means include a transformer having a primary winding connected to said capacitor and a secondary winding coupled to said gate terminal of said pulse-terminating thyristor.

11. A pulse switching circuit in accordance with claim 5 wherein said circuit means for coupling said cathode terminal of said pulse-terminating thyristor to said point of ground potential include said resistor.

12. A pulse switching circuit in accordance with claim 5 and further comprising means for isolating said cathode terminal of said pulse-terminating thyristor from said source of direct voltage, said last-mentioned means including an isolation diode having an anode and a cathode, means for connecting said last-mentioned anode to said cathode terminal of said pulse-terminating thyristor, and means for connecting said cathode of said diode to said load resistor.

13. A pulse switching circuit in accordance with claim 5 and further comprising an isolation diode provided with an anode and a cathode, means for coupling said anode of said diode to said load resistor,
and means for connecting said cathode of said diode to said anode terminal of said pulse-forming thyristor.

14. A pulse switching circuit in accordance with claim 5 and further comprising means for blocking premature voltage development across said utilization circuit,
said last-mentioned means including an isolation diode,
and means for coupling said diode between one of said terminals of said pulse-forming thyristor and one of said terminals of said pulse-terminating thyristor.

15. A pulse switching circuit in accordance with claim 5 and further comprising a load capacitor in said utilization circuit and connected in parallel with said load resistor,
a current limiter circuit connected between said anode terminal of said pulse-forming thyristor and said parallelly connected load resistor and load capacitor,
said current limiter comprising a single resistor serially connected with a single inductor and bridged by a pair of steering diodes.

16. A pulse switching circuit in accordance with claim 15 and further comprising an isolation diode connected between said limiter circuit and said pulse-forming thyristor,
said isolation diode having an anode connected to said limiter circuit and also having a cathode connected to said anode terminal of said pulse-forming thyristor.

17. A pulse switching circuit in accordance with claim 5 wherein said control means for firing said pulse-terminating thyristor include a resonant circuit having a capacitor,
means for connecting said resonant circuit across said anode and cathode terminals of said pulse-forming thyristor,
a circuit path for applying current from said source of direct voltage to said last-mentioned capacitor for charging it,
said circuit path being normally held open by said normally non-conductive pulse-terminating thyristor,
and said circuit path being adapted to become closed for charging said last-mentioned capacitor in response to the firing of said pulse-terminating thyristor.

18. A pulse switching circuit in accordance with claim 17 wherein said resonant circuit further includes an inductor subject to over-voltage,
and means for providing an escape path for said over-voltage,
said last-mentioned means including a clamping diode having a cathode connected to said source of direct voltage and an anode connected to said inductor.

19. A pulse-switching circuit in accordance with claim 5 wherein said pulse-terminating thyristor is subject to over-voltage,
and means for providing an escape path for said over-voltage,
said last-mentioned means including a clamping diode having an anode connected to said point of ground potential and a cathode connected to said cathode terminal of said pulse-terminating thyristor.

20. A pulse switching circuit in accordance with claim 5 and further comprising means for varying the width of a pulse generated by said circuit,
said last-mentioned means including a pulse-varying thyristor having anode, cathode, and gate terminals,
and means for connecting one of said terminals of said pulse-varying thyristor to a point that is electrically coupled to said load resistor and also to said anode terminal of said pulse-forming thyristor.

21. A pulse switching circuit in accordance with claim 20 and further comprising means for connecting said pulse-varying thyristor in parallel with said pulse-forming thyristor,
said last-mentioned means including means for connecting said cathode terminal of said pulse-varying thyristor to said point of ground potential.

22. A pulse switching circuit in accordance with claim 20 and further comprising means for coupling said gate terminal of said pulse-terminating thyristor to said anode terminal of said pulse-forming thyristor and also to said anode terminal of said pulse-varying thyristor.

References Cited

UNITED STATES PATENTS 3,171,040 2/1965 Goebel ---------------- 307—252

JOHN S. HEYMAN, Primary Examiner

JOHN ZAZWORSKY, Assistant Examiner

U.S. Cl. X.R.

307—237, 252